(12) United States Patent
Li et al.

(10) Patent No.: US 8,053,097 B2
(45) Date of Patent: Nov. 8, 2011

(54) APPARATUS HAVING A NANOCOMPOSITE PROTECTION LAYER

(75) Inventors: Lei Li, Wexford, PA (US); Yiao-Tee Hsia, Pleasanton, CA (US); Paul Max Jones, St. John, VI (US); Earl Chrzaszcz Johns, Sewickley, PA (US); James Dillion Kiely, Sewickley, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 136 days.

(21) Appl. No.: 12/348,443

(22) Filed: Jan. 5, 2009

(65) Prior Publication Data
US 2010/0173176 A1   Jul. 8, 2010

(51) Int. Cl.
*G11B 5/66* (2006.01)

(52) U.S. Cl. ................. 428/834; 428/835; 428/835.6; 428/835.7

(58) Field of Classification Search .............. None
See application file for complete search history.

(56) References Cited

U.S. PATENT DOCUMENTS

| | | | |
|---|---|---|---|
| 7,195,828 B2 * | 3/2007 | Gunsel et al. ............. | 428/835.6 |
| 7,440,233 B2 * | 10/2008 | Takahashi .................. | 360/135 |
| 2003/0108777 A1 * | 6/2003 | Gunsel et al. ............ | 428/694 TP |
| 2006/0029795 A1 | 2/2006 | Sawyer et al. | |
| 2007/0087227 A1 * | 4/2007 | Ma et al. .................... | 428/833.1 |
| 2007/0105726 A1 | 5/2007 | Sawyer et al. | |
| 2007/0225178 A1 | 9/2007 | Sawyer et al. | |

* cited by examiner

*Primary Examiner* — Holly Rickman
(74) *Attorney, Agent, or Firm* — Robert P. Lenart, Esq.; Pietragallo Gordon Alfano Bosick & Raspanti, LLP

(57) ABSTRACT

An apparatus includes a substrate, a recording layer on the substrate, and a nanocomposite layer on the recording layer, the nanocomposite layer including a wear-resistant material and a solid lubricant material, wherein the atomic percentage of the solid lubricant material in the nanocomposite layer is in a range from about 5% to about 99%. A method of making the apparatus is also provided.

6 Claims, 3 Drawing Sheets

APPARATUS HAVING A NANOCOMPOSITE PROTECTION LAYER

BACKGROUND

An overcoat layer is commonly placed on top of magnetic recording media to protect the magnetic media layers under the overcoat from corrosion. The overcoat can serve to reduce friction and wear caused by intermittent head-disc contact. One well-known overcoat material is diamond-like carbon (DLC) material. A typical thickness of the DLC overcoat layer ranges from 2.5 nm to 4.0 nm.

On top of this overcoat layer, there is usually a thin layer of liquid lubricant that acts as the buffer layer to further reduce corrosion, as well as to serve as a lubricating layer for the air bearing slider to glide over. A typical lubricant is a perfluoropolyether (PFPE), e.g., Fomblin® Z and Y lubricants from Solvey Solexis Inc. A typical thickness of the lubricant layer is between 1 and 2 nm.

As the areal density is increased in hard disk drive industry, the head-to-media spacing (HMS) must also be reduced. To this end, it is desirable to provide an alternative to the current two protection layers, e.g. lubricant and overcoat.

SUMMARY

In a first aspect, the invention provides an apparatus including a substrate, a recording layer on the substrate, and a nanocomposite layer on the recording layer, the nanocomposite layer including a wear-resistant material and a solid lubricant material, wherein the atomic percentage of the solid lubricant material in the nanocomposite layer is in a range from about 5% to about 99%.

In another aspect, the invention provides a method including: providing a substrate, forming a recording layer on the substrate, and depositing a nanocomposite layer on the recording layer, the nanocomposite layer including a wear-resistant material and a solid lubricant material, wherein the atomic percentage of the solid lubricant material in the nanocomposite layer is in a range from about 5% to about 99%.

DETAILED DESCRIPTION OF THE INVENTION

In one aspect, this invention provides a recording media having a nanocomposite protection layer that can be used in magnetic recording applications.

Figure 1:
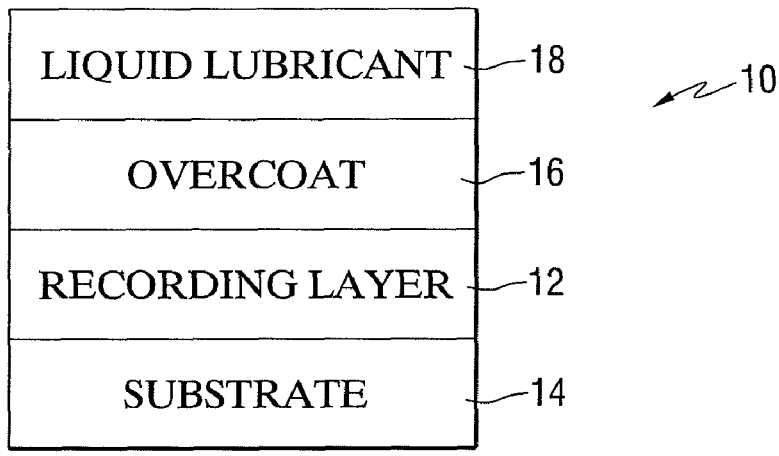
FIG. 1 is a schematic representation of a prior art storage media.

FIG. 1 is a schematic representation of a prior art storage media 10 that can be used. The storage media includes a recording layer 12 on a substrate 14. An overcoat 16 is positioned on the recording layer. A liquid lubricant 18 is positioned on the overcoat.

Figure 2:
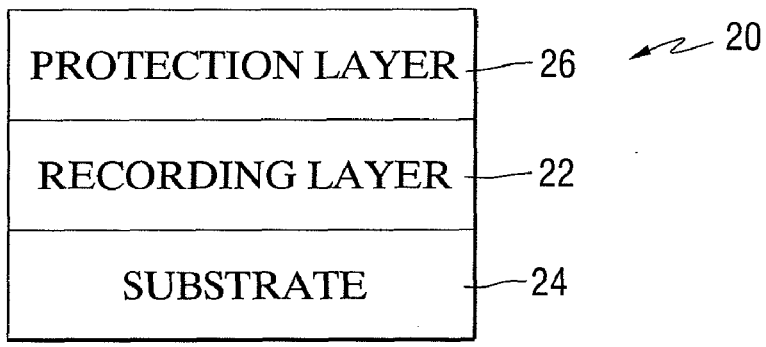
FIG. 2 is a schematic representation of a storage media in accordance with an aspect of the invention.

FIG. 2 is a schematic representation of a storage media 20 in accordance with an aspect of the invention. The storage media of FIG. 2 includes a recording layer 22 on a substrate 24, and a single protective layer 26 on the recording layer. As used herein, a recording layer comprises one or more layers of material that are used to store information. The recording layer may include a stack of one or more magnetic layers, underlayers, interlayers, or other layers. Thus a recording layer may encompass multiple layers in the various embodiments.

The single protection layer comprises a nanocomposite layer including a wear-resistant material and a solid lubricant material. In the following description the wear-resistant material is referred to as a hard material and the solid lubricant material is referred to as a soft material.

The soft material provides low friction and low surface tension, while the hard material provides high hardness and density. The total thickness of the protection layer is between about 0.5 nm and about 5 nm, and the hard material has a hardness of 10 GPa or above.

The structure illustrated in FIG. 2 provides improved thermal stability compared to the structure of FIG. 1 due to the removal of liquid lubricant layer, which in one embodiment, enables it to be applied in heat-assisted magnetic recording (HAMR). In addition, the composite protection layer provides improved corrosion protection, not only by inclusion of a high density hard material, but also by having a low surface tension (i.e., high water resistance). Furthermore, the single protective layer of FIG. 2 can have a lower overall thickness due to the one-layer composite design.

The soft material in the protective layer should have low surface tension, good lubricity, and optionally, high thermal stability. Examples of such materials include sputtered polytetrafluoroethylene (PTFE), CVD PTFE, and CF$_x$ film prepared by plasma enhanced chemical vapor deposition (PECVD). Another example is sputtered WO$_x$. The hard material should have high density and high hardness. Examples of such materials include diamond-like carbon (DLC) deposited by sputter or ion beam deposition (IBD) or filtered cathodic arc (FCA) methods. Other examples include, but are not limited to, Al$_2$O$_3$, SiN, TiN, TiC and YSZ.

The single protection layer can be prepared by several methods. In one method, the hard and soft materials are co-deposited, e.g., co-sputtered, using two separate sputter targets. The mole ratio between the soft material and the hard material in the protection layer can range from about 0.2 to 100.

Another method uses a composite target during the deposition, e.g., sputter. Either RF or DC sputter can be utilized depending on the material choices. The mole ratio between the soft material and the hard material could range from about 0.2 to 100.

In a CVD case, two or more precursor gases can be used to achieve the desired structure. Examples of such precursor gases include: C$_2$H$_2$ and CF$_4$ or CHF$_3$ or C$_2$F$_4$.

Another method uses a layer-by-layer deposition, e.g., alternately sputtering a soft material and a hard material. The thickness of each layer could be in a range from about 0.2 to about 2 nm. The ratio between soft material and hard material could range from about 0.2 to 100. The total number of "layers" could be between 2 and 25.

The performance of the protection layer can be tailored by adjusting the ratio between the soft and hard materials to achieve performance similar to that of the previously used liquid lubricant or overcoat. In some applications, a liquid lubricant can also be added to the protection layer to achieve the desired properties.

Figure 3:
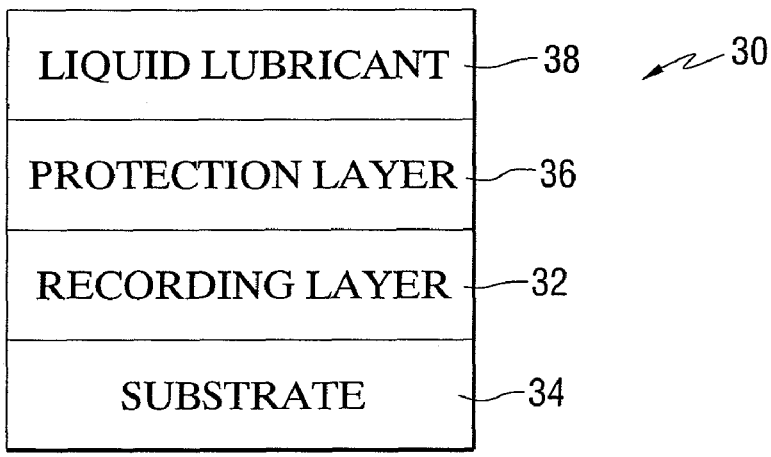
FIG. 3 is a schematic representation of a storage media in accordance with another aspect of the invention.

FIG. 3 is a schematic representation of a storage media 30 in accordance with another aspect of the invention. The storage media of FIG. 3 includes a recording layer 32 on a substrate 34, a single protective layer 36 on the recording layer, and a liquid lubricant layer 38 on the protective layer. In this case, the protection layer replaces the overcoat layer of FIG. 1, and may provide better corrosion protection due to the combination of the low surface energy (high water resistance) of the soft material and the high density of the hard material.

Figure 4:
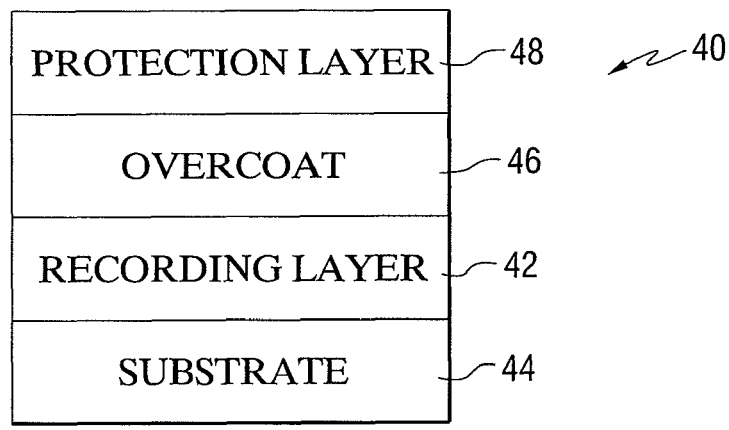
FIG. 4 is a schematic representation of a storage media in accordance with another aspect of the invention.

In other applications, the protection layer can be coated on the overcoat, e.g., Ion Beam Deposition (IBD) carbon, to achieve the desired properties. FIG. 4 is a schematic representation of a storage media 40 in accordance with another aspect of the invention. The storage media of FIG. 4 includes a recording layer 42 on a substrate 44, an overcoat layer 46 on the recording layer, and a single nanocomposite protective layer 48 on the overcoat layer. In this case, the protection layer serves as the lubricant.

Specific examples of the application of a protective layer to a storage media are set forth below. In the examples, the Co layer serves as a testing layer. It should be noted that the Co layer in the example can be replaced by a recording layer as defined above.

EXAMPLE 1

A glass substrate was sputtered with Cobalt via a conventional DC sputter to form a 10 nm thick Co layer on the substrate. Then the sample was co-sputtered with PTFE and YSZ to form a protective layer on the Co layer. Co-sputter can be implemented by utilizing two separate RF sputter targets in a conventional sputter system that allows RF co-sputter of two targets. The sputter rates are adjusted so that the total thickness of the protective layer can range from about 2 nm to about 5 nm. The PTFE atomic percentage in the resulting film can vary from about 5% to about 99%, depending on the application.

EXAMPLE 2

A glass substrate was sputtered with Cobalt via a conventional DC sputter to form a 10 nm thick Co layer on the substrate. Then the sample was co-sputtered with PTFE and $Al_2O_3$ to form a protective layer on the Co layer. Co-sputter can be implemented with a conventional sputter system with co-sputter function. The sputter rates can be adjusted so that the total thickness of the film can range from about 2 nm to about 5 nm. The PTFE atomic percentage in the resulting film can vary from about 5% to about 99%, depending on the application. The full structure magnetic media can be manufactured with the same sputter system with the procedure as mentioned above.

EXAMPLE 3

A glass substrate was sputtered with Cobalt via a conventional DC sputter to form a 10 nm thick Co layer on the substrate. Then the sample was sputtered with a composite target made of PTFE and graphite, to form a protective layer on the Co layer. The fabrication process of the composite target is as follows. Machine the PTFE/graphite composite sheet to the desired geometry. Then etch the one side of the sheet with sodium solution. Afterwards, the sheet is bonded to a copper backing plate with a conductive epoxy. The sputter rate is adjusted so that the total thickness of the film can range from about 2 nm to about 5 nm. The PTFE atomic percentage in the target can vary from about 5% to about 99%, depending on the application.

EXAMPLE 4

Figure 5:
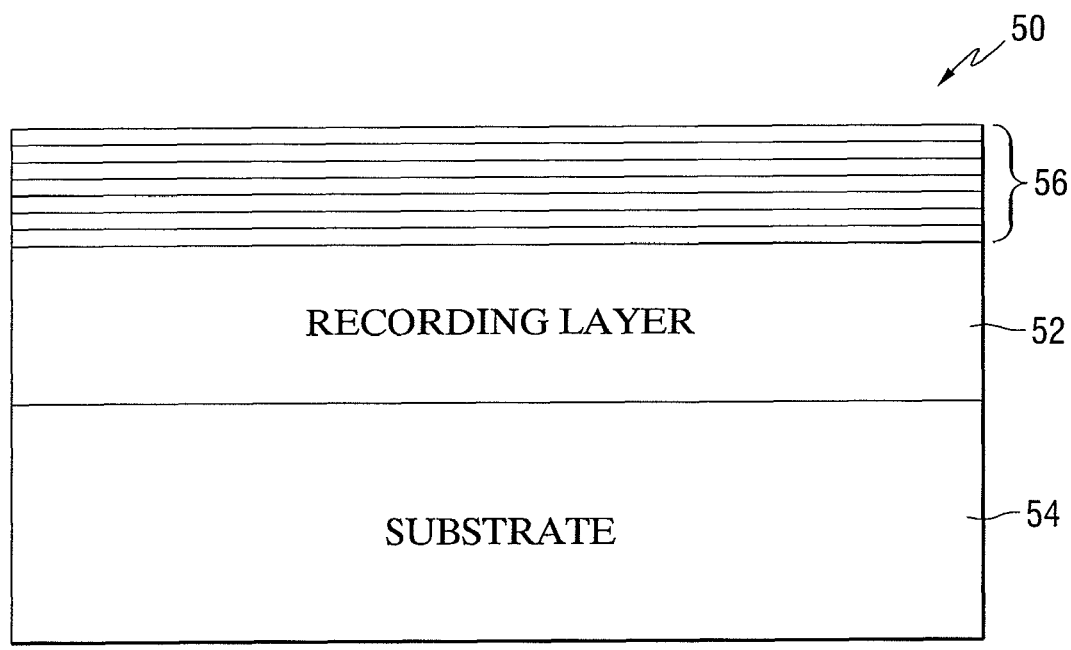
FIG. 5 is a schematic representation of a storage media in accordance with another aspect of the invention.

A glass substrate was sputtered with Tantalum to form a 10 nm thickness of Tantalum on the substrate. Then the sample was sputtered via layer-by-layer deposition of PTFE and carbon alternatively. For both PTFE and carbon, the sputter rate was calibrated by an X-ray Reflectometry (XRR) measurement of a thick film. The sputter time of each target is adjusted so that the desired structure is achieved. FIG. 5 is a schematic representation of a storage media 50 in accordance with an aspect of the invention. The storage media of FIG. 5 includes a recording layer 52 on a substrate 54, and a multilayer protective layer 56 on the recording layer. The protective layer includes alternating layers of PTFE and carbon.

Figure 6:
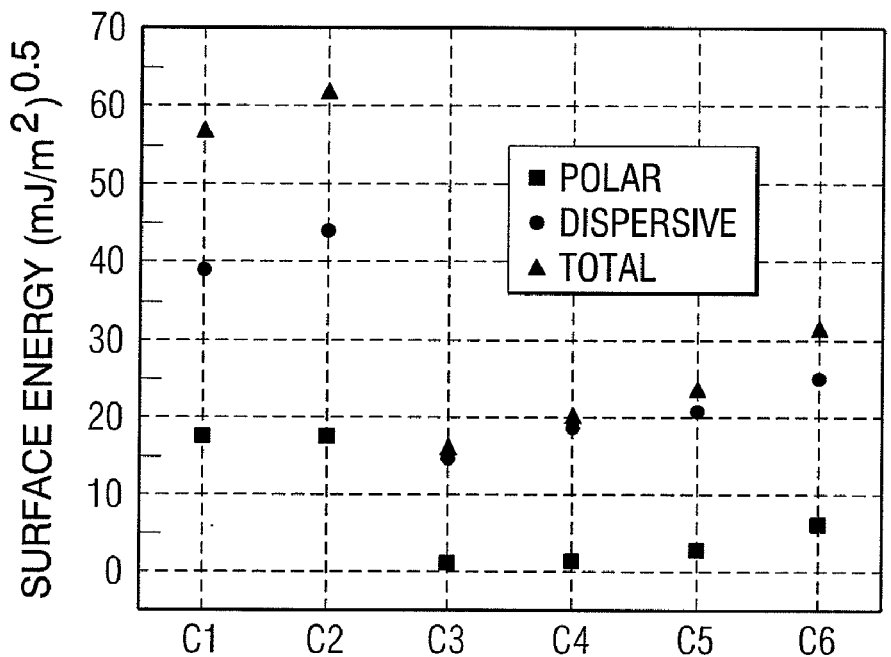
FIG. 6 is a graph of surface energies of multilayer PTFE/carbon samples.

FIG. 6 is a graph of surface energies of multilayer PTFE/carbon samples, wherein, line C1 is for a Glass/Ta magnetic media; C2 is for a Glass/Ta/carbon 4 nm; C3 is for a Glass/Ta/PTFE 4 nm; C4 is for a Glass/Ta/carbon 2 nm/PTFE 2 nm; C5 is for a Glass/Ta/(carbon 1 nm/PTFE 1 nm)$_2$; and C6 is for a Glass/Ta/(carbon 0.5 nm/PTFE 0.5 nm)$_4$. As can be seen from the data in FIG. 6, even when the top PTFE layer is as thin as 0.5 nm, the surface energy is low. This is especially true for the polar surface energy, which suggests that the protection layer has high water resistance.

EXAMPLE 5

Figure 7:
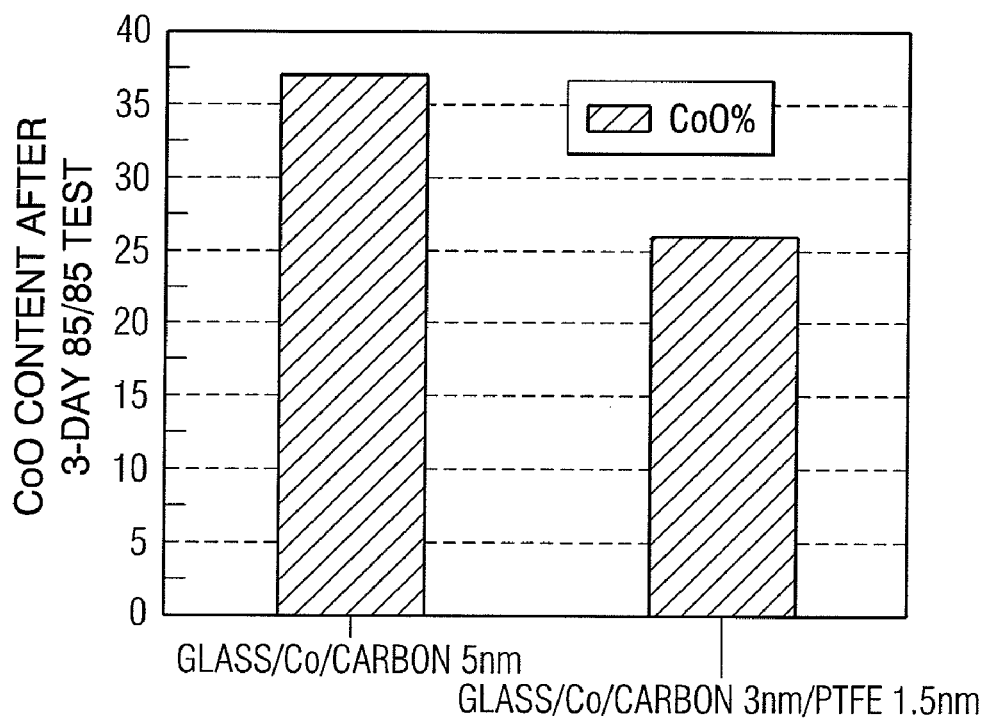
FIG. 7 is a graph of corrosion results of two samples.

A glass substrate was sputtered with cobalt via a conventional DC sputter to form a 10 nm thick Co layer on the substrate. Then the sample was sputtered with 3 nm carbon followed by 1.5 nm PTFE. The PTFE sputter condition is as follows. The RF power is 200 W and the Ar flow rate is 112 sccm. The carbon sputter condition is as follows. The DC power is 737 W, the Ar flow rate is 39 sccm, and the $H_2$ flow rate is 19 sccm. For both PTFE and carbon, the sputter rate was calibrated by XRR measurement of a thick film. The sputter time of each target is adjusted so that the desired film thickness is achieved. As a reference for Glass/Co/carbon 3 nm/PTFE 1.5 nm sample, a Glass/Co/carbon 5 nm sample was also made. FIG. 7 is a graph of corrosion results of the two samples. As shown in FIG. 7, the combination of low surface energy and high density is more effective in corrosion protection than high density alone.

While the invention has been described in terms of several examples, it will be apparent to those skilled in the art that various changes can be made to the disclosed examples without departing from the scope of the invention as defined by the following claims. The implementations described above and other implementations are within the scope of the claims.

What is claimed is:

1. An apparatus comprising:
a substrate;
a recording layer on the substrate; and
a single nanocomposite protection layer on the recording layer, the nanocomposite protection layer including a wear-resistant material and a solid lubricant material, wherein the atomic percentage of the solid lubricant material in the nanocomposite protection layer is in a range from about 5% to about 99%, and wherein the wear-resistant material comprises at least one of: diamond-like carbon, $Al_2O_3$, SiN, TiN, TiC or YSZ.

2. The apparatus of claim 1, wherein the wear-resistant material has a hardness of at least 10 GPa.

3. The apparatus of claim 1, wherein the solid lubricant material comprises at least one of:
sputtered PTFE, or CVD $CF_x$, or $WO_x$.

4. The apparatus of claim 1, wherein:
the nanocomposite protection layer has a thickness in the range from about 1 mn to about 5 nm.

5. The apparatus of claim 1, further comprising:
a liquid lubricant on the nanocomposite protection layer.

6. The apparatus of claim 1, further comprising:
an overcoat layer between the nanocomposite protection layer and the recording layer.

\* \* \* \* \*